(12) United States Patent
Madokoro et al.

(10) Patent No.: US 7,435,972 B2
(45) Date of Patent: Oct. 14, 2008

(54) FOCUSED ION BEAM APPARATUS AND LIQUID METAL ION SOURCE

(75) Inventors: Yuichi Madokoro, Hitachinaka (JP); Shigeru Izawa, Mito (JP); Kaoru Umemura, Tokyo (JP); Hiroyasu Kaga, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/714,235

(22) Filed: Mar. 6, 2007

(65) Prior Publication Data

US 2007/0152174 A1    Jul. 5, 2007

Related U.S. Application Data

(63) Continuation of application No. 11/205,086, filed on Aug. 17, 2005, now Pat. No. 7,189,982.

(30) Foreign Application Priority Data

Sep. 10, 2004    (JP) .............................. 2004-263201

(51) Int. Cl.
*H01J 49/00*    (2006.01)
*H01J 27/00*    (2006.01)
*G21K 5/10*    (2006.01)

(52) U.S. Cl. ............... 250/423 R; 250/288; 250/396 R; 250/492.21; 250/492.3

(58) Field of Classification Search ............ 250/396 R, 250/492.21, 288, 306, 307, 309, 398, 423 R, 250/424–427, 492.1, 492.2, 492.23, 492.3
See application file for complete search history.

(56) References Cited

U.S. PATENT DOCUMENTS

| | | | | |
|---|---|---|---|---|
| 4,609,809 A | * | 9/1986 | Yamaguchi et al. | .... 219/121.35 |
| 4,900,695 A | * | 2/1990 | Takahashi et al. | ............ 438/625 |
| RE33,193 E | * | 4/1990 | Yamaguchi et al. | ......... 250/309 |
| 5,055,696 A | * | 10/1991 | Haraichi et al. | .......... 250/492.2 |
| 5,153,440 A | * | 10/1992 | Yasaka | ........................ 250/424 |
| 5,369,279 A | * | 11/1994 | Martin | .................... 250/396 R |
| 6,331,712 B1 | | 12/2001 | Sugiyama et al. | |

(Continued)

FOREIGN PATENT DOCUMENTS

JP    5-159730    6/1993

(Continued)

*Primary Examiner*—Bernard E Souw
(74) *Attorney, Agent, or Firm*—McDermott Will & Emery LLP

(57) ABSTRACT

In an aperture for use in an ion beam optical system having its surface coated with a liquid metal, instability of an ion source attributable to sputtering and re-deposition of an aperture base material is prevented. A focused ion beam apparatus using a liquid metal ion source has an aperture for limiting an ion beam diameter. The aperture has a vessel formed with a recess having, at its surface lowermost point, an aperture hole through which the ion beam passes and a liquid metal mounted on the recess, the liquid metal being used for the liquid metal ion source. Preferably, the aperture may be minimized in area of aperture entrance hole inner surface which exposes the base material by tapering an aperture hole portion, by which the ion beam passes, on the downstream side.

8 Claims, 3 Drawing Sheets

U.S. PATENT DOCUMENTS

| | | |
|---|---|---|
| 6,414,307 B1 | 7/2002 | Gerlach et al. |
| 7,005,651 B2 * | 2/2006 | Kaga et al. ............... 250/423 R |
| 7,189,982 B2 * | 3/2007 | Madokoro et al. ..... 250/492.23 |
| 7,211,805 B2 * | 5/2007 | Kaga et al. ............... 250/423 R |
| 2005/0127304 A1 * | 6/2005 | Kaga et al. ............... 250/423 R |
| 2005/0178980 A1 | 8/2005 | Skidmore et al. |
| 2006/0054840 A1 * | 3/2006 | Madokoro et al. ..... 250/492.21 |
| 2006/0097186 A1 * | 5/2006 | Kaga et al. ................... 250/425 |
| 2007/0152174 A1 * | 7/2007 | Madokoro et al. ..... 250/492.21 |
| 2007/0257200 A1 * | 11/2007 | Kaga et al. ............... 250/423 R |

FOREIGN PATENT DOCUMENTS

| | | |
|---|---|---|
| JP | 3190395 | 5/2001 |
| JP | 2001-160369 | 6/2001 |

* cited by examiner

FOCUSED ION BEAM APPARATUS AND LIQUID METAL ION SOURCE

RELATED APPLICATIONS

This application is a continuation of application Ser. No. 11/205,086, filed on Aug. 17, 2005, now U.S. Pat. No. 7,189,982, which in turn claims the benefit of Japanese Patent Application No. 2004-263201, filed on Sep. 10, 2004, the disclosures of which Applications are incorporated by reference herein.

BACKGROUND OF THE INVENTION

The present invention relates to a focused ion beam (FIB) apparatus using a liquid metal ion source to perform, for example, cutting of a specimen and more particularly, to an FIB apparatus provided with an aperture having a less adverse influence upon the liquid metal ion source and a structure of the aperture used for the FIB apparatus.

In the FIB apparatus, a liquid metal ion source is highly bright and reduced in source size and is therefore used in general as the ion source. In order to use the liquid metal ion source stably, a liquid metal of the ion source must be kept to be clean and for this end, formation of a gallium oxide film, surface contamination due to, for example, a sputter re-deposited film and intrusion of impurities must be suppressed to a minimum.

Conventionally, with a view to attaining the object as above and protecting an aperture per se by taking advantage of the fluidity of liquid metal, a method of covering the aperture with a liquid metal has been proposed in, for example, Japanese Patent No. 3190395 (Patent Document 1) or JP-A-5-159730 (Patent Document 2). More particularly, a liquid metal used as an ion source material is held by coating it on the surface of an aperture or by permeating it into a sintered body so that contamination of a liquid metal ion source due to sputter re-deposition of a material of the aperture and damage of the aperture per se may be prevented.

Especially, in an aperture disposed immediately beneath an ion source, a material constituting the aperture greatly affects the liquid metal ion source by its re-deposition on the source. Therefore, as described in JP-A-2001-160369 (Patent Document 3), an aperture having a dish-like vessel in which a liquid metal is carried or pooled is used to prevent instability attributable to re-deposition.

In the technologies described in the Patent Documents 1 and 2, however, a liquid metal is in essence impregnated in a porous material and there is a possibility that during use, the porous material is sputtered and the ion source is contaminated, giving rise to a fear that the ion source becomes unstable. In the technology described in the Patent Document 3, the liquid metal is carried on the dish-like vessel and as compared to the techniques described in the Patent Documents 1 and 2, the amount of an ion beam impinging upon a portion other than the liquid metal can be decreased. But, in a hole of the dish-like vessel through which the ion beam passes, the ion beam is irradiated on a material other than the liquid metal and there is a possibility that the material sputtered from the hole portion will contaminate the liquid metal ion source. Further, since a portion of dish-like vessel at which the liquid metal is pooled is flat, the liquid metal coheres in an island pattern on the bottom of the dish-like vessel as the quantity of liquid metal decreases and there is also a possibility that the liquid metal is lost around the hole of disk-like vessel through which the ion beam passes.

SUMMARY OF THE INVENTION

The present invention contemplates solving of the above problems and it is an object of this invention is to provide an aperture of a focused ion beam apparatus which can permit an ion source to operate stably for a long time and a focused ion beam apparatus using the aperture.

According to the present invention, in a focused ion beam apparatus using a liquid metal ion source, an aperture for limiting the ion beam diameter comprises a vessel formed with a recess having, at its surface lowermost point, an aperture hole through which the ion beam passes and a liquid metal carried on the recess, which liquid metal is used for the liquid metal ion source.

What is meant by the recess having an aperture hole at its surface lowermost point signifies that an aperture hole 2 is positioned at the lowest point of a recess 1 holding a liquid metal to cause the liquid metal to concentrate to the vicinity of the aperture hole by its weight, thereby making it possible to form a cover which does not expose till an edge portion of the hole. Exemplified as this type of recess is either a recess whose peripheral portion is tapered or a recess having its whole bottom slanted to enable the aperture hole to be positioned at the lowest point.

According to this invention, a focused ion beam apparatus can be provided which can enable the ion source to operate stably.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DESCRIPTION OF EMBODIMENTS

The inventor of the present invention has found the following problems encountered in the prior arts.

(1) Stability is degraded under the influence of sputtering of a base material arising from the inner wall of an aperture hole not covered with liquid metal.
(2) During use, the covering capability of liquid metal is deteriorated to cause an exposed portion at which the base material is sputtered and desired stability cannot be obtained.
(3) An oxide film is formed on the surface of liquid metal on the aperture and fluidity necessary for the liquid metal to move in accordance with consumption of the liquid metal by sputtering under irradiation of ions is degraded.
(4) The liquid metal is consumed by sputtering through use for a predetermined time to thereby expose the base material which in turn is sputtered to create contaminants.
(5) Liquid metal sputtered from the aperture coated with the liquid metal is deposited and condensed on, for example, an overlying electrode so as to be turned into liquid droplets and there result dielectric breakdown and discharge which adversely affect stable operation of an optical system.

Figure 1:
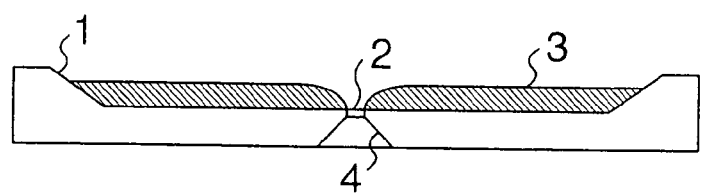
FIG. 1 is a sectional view of an aperture coated with a liquid metal according to the present invention.

To solve problematic point (1), taper-working 4 is applied to the downstream side of aperture hole 2 uncovered with liquid metal as shown in FIG. 1 to minimize the inner wall area of a beam-interactive aperture. Further, the aperture hole 2 is positioned at a lowermost point of the recess 1 holding the liquid metal to permit the liquid metal to be concentrated to the vicinity of the aperture hole by its weight, thereby making it possible to form a cover unexposed till the edge portion of the hole.

Figure 2:
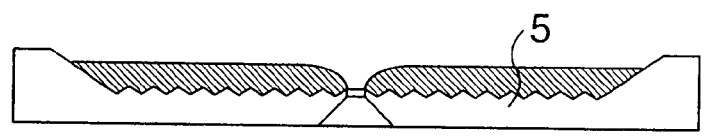
FIG. 2 is a diagrammatic sectional view showing the range of working irregularities on the surface in the aperture according to the invention.

To solve problematic point (2), wettability of the aperture surface for the liquid metal is improved. The wettability can be attained by forming fine irregularities 5 as shown in FIG. 2 through etching of the base material surface or work technique such as mechanical polishing and cleaning a resulting structure through, for example, high temperature heating. Alternatively, equivalent effect can be accomplished through dry treatment such as radical irradiation.

Figure 3:
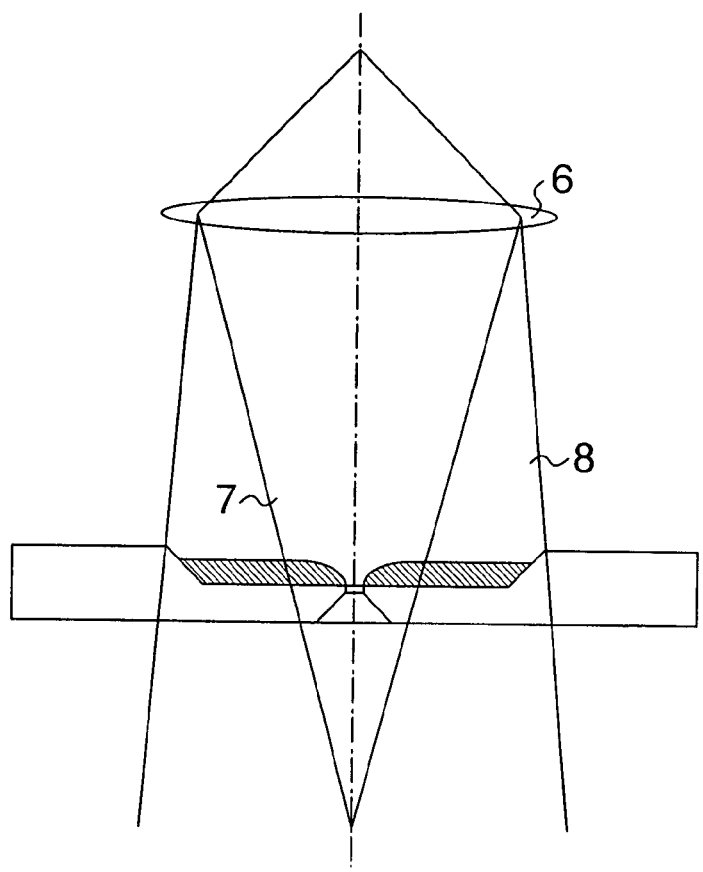
FIG. 3 is a diagram showing the relation between an ion beam irradiation range and a liquid metal coating range in the aperture of the invention.

To solve problematic point (3), the size of an area covered with the liquid metal is limited to such an extent that an oxide film formed on the overall surface of the covered area can be removed under irradiation of an ion beam. As shown in FIG. 3, by establishing not only a normal beam focus state 7 but also a maximally broadened focus state 8 on the aperture underlying a lens 6 and forming a liquid metal covered portion which is narrower than the state 8, the overall covered area can be irradiated and the oxide film on the surface can be cleaned out through sputtering.

Figure 4:
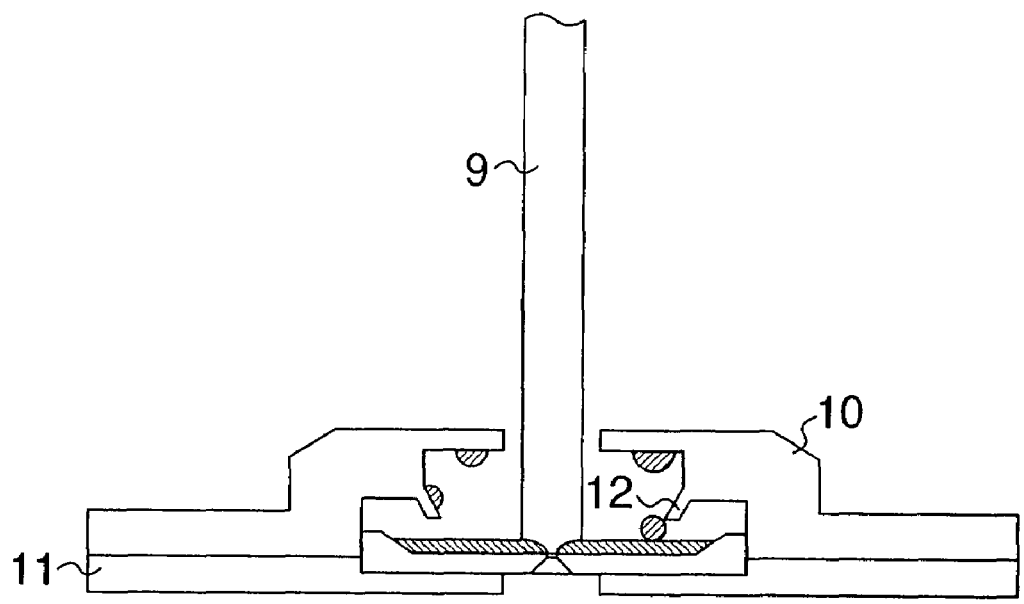
FIG. 4 is a sectional view showing a structure of parts for returning sputtered liquid metal to the aperture surface in the aperture coated with the liquid metal according to the invention.

To practically solve problematic point (4), a mechanism is provided which refluxes sputtered liquid metal onto the aperture by utilizing fluidity of the liquid metal to thereby prolong time for the base material to expose and hence lifetime of the aperture. As shown in FIG. 4, a cover (shield plate) 10 made of a metal plate is disposed in close proximity to the upper surface of the aperture and a trough structure (guide) 12 for guidance to an aperture liquid metal pool is attached to the bottom of the cover 10.

To solve problematic point (5), a shield plate is interposed between the aperture and an overlying electrode so that liquid metal can be prevented from being re-deposited on the overlying electrode.

The aperture hole of the aperture according to the invention is not a circular hole having a uniform diameter like a mechanically worked hole but takes the form of such a tapered surface that a portion other than the circumference defining the aperture diameter, especially, an aperture conical hole portion on the downstream, by which ions pass, grows downstream diametrically. In other words, a structure is employed in which the area of an aperture hole inner wall surface liable to be sputtered by ions passing through the hole is minimized. This contrivance is made with the aim of making the ion source less contaminated by particles sputtered from the inner base material and returning to the upstream side to thereby permit the ion source to be used even for a long time without being decreased in its stability.

Even when a base material having high wetting capability for a liquid metal is used, the aperture hole inner surface cannot be kept to be placed constantly in wet condition, that is, cannot be kept to be covered constantly with the liquid metal and the fact that generation of sputtered particles from the inner surface and re-deposition of them to the liquid metal ion source give rise to a fundamental cause of degraded stability of the liquid metal ion source is empirically proven through many trial manufactures and experiments, leading to the aforementioned contrivance. Without the tapered structure, the operational stability of the ion source is degraded expressly, with the result that the number of operations of flashing required during the use for a predetermined time increases to reduce the effective use time and the lifetime of the ion source.

When the aperture is used by keeping the wetting capability of aperture surface lowered, a portion at which the wetting capability is low is exposed as the quantity of liquid metal decreases and the base material is sputtered at the exposed portion, so that the ion source is deposited with sputtered particles and is rendered unstable. In order to improve the wetting capability, it is effective to form fine irregularities of about 10 μm on the surface through wet etching, for instance. Adversely, irregularities formed through rough polishing result in a tendency toward exposure of raised or convex portions, giving rise to a reverse effect for the sake of maintenance of stability. In addition, when the surface is cleaned by heating it at high temperatures in vacuum to remove an oxide film from the surface, necessary wetting capability can be attained. A dry treatment such as radical irradiation is also effective.

An ion beam optical system is used in vacuum but moisture and oxygen exist in the form of residual gases and an oxide film is formed on the liquid metal surface covering the aperture. Normally, in a range irradiated with a beam, the surface is sputtered and no oxide film remains but in the unirradiated periphery, an oxide film is formed which considerably reduces the fluidity of the liquid metal and the quantity of liquid metal usable for covering the aperture surface is substantially reduced. Ultimately, the surface oxide film is sputtered toward the upstream, causing re-deposition and degraded stability. Accordingly, in a method effectively adapted for long-term effective use of the aperture covered with liquid metal, the overall liquid surface or level is irradiated at intervals of suitable time to remove the oxide film. To this end, the radius of the portion covered with the liquid metal needs to be smaller than a maximum irradiation radius on the aperture. Accordingly, in the present invention, for the purpose of cleaning the overall surface through sputtering at intervals of suitable time, the radius of the covered portion is set to be smaller than the radius of maximum irradiation. Through this, even in a long-term use, the liquid metal surface on the aperture can be kept to be cleaned and a long lifetime can be attained.

Even in the liquid metal, sputtering by an ion beam takes place as in the case of a normal solid, so that even in the aperture covered with liquid metal, there is such a life that the liquid metal withers and unstableness of ion source operation results. It has been known that though depending on accelerating energy at the time of irradiation, several atoms are normally sputtered on the aperture under irradiation of one ion and liquid metal is more consumed on the aperture than in the liquid metal source. To exchange the aperture or supplement the liquid metal in the ion beam optical system, the vacuum vessel must once be opened to the atmosphere and then again evacuated to vacuum. Therefore, it is of course preferable that once carried, an aperture can be used for as long a period as possible, that is, comparably to the liquid metal ion source. For this end, a method is conceivable according to which a great quantity of liquid metal is coated on the aperture or the liquid metal pool is made to be large but the method is found to be practically unsatisfactory because the arrangement of the liquid metal changes owing to vibration, shock and temperature change and such inconvenience as blocking of hole and dropping is caused to increase danger. Preferably, the quantity of liquid metal to be held is suppressed to a maximum of 100 mg or less and for the sake of long-term use, a structure may precedently be established which can catch sputtered liquid metal above the aperture and reflux again to the aperture by taking advantage of the fluidity of liquid metal. This can prolong the lifetime considerably. With a similar structure, the liquid metal can be prevented from being deposited on an unwanted portion, especially onto parts such as a lens applied with an intensive electric field and a high-voltage insulator whose reliability is deteriorated by surface contamination.

In the following, the present invention will be described specifically by way of embodiments 1 and 2.

Embodiment 1

Figure 5:
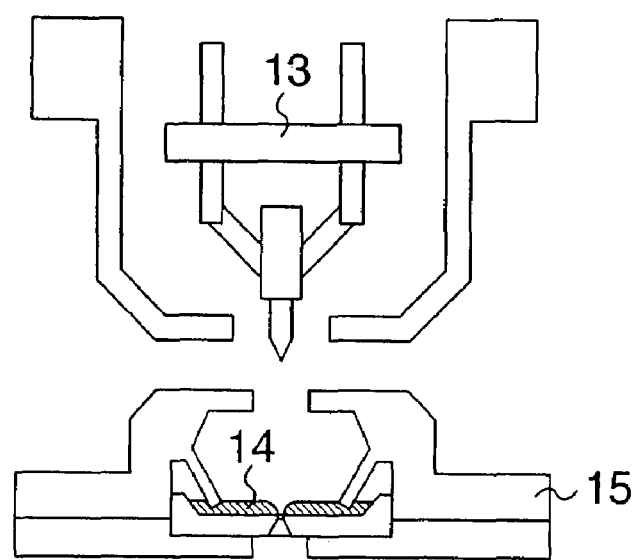
FIG. 5 is a diagram showing a configuration in which the aperture coated with the liquid metal according to the invention is arranged directly beneath a liquid metal ion source.

Referring to FIG. 5, there is illustrated embodiment 1 of the invention in which an aperture according to teachings of the present invention is so used as to be disposed immediately beneath a gallium liquid metal ion source. As a base material, tungsten is used having a thickness of 1 mm, a diameter of 10 mm and an aperture hole diameter of 0.5 mm. A recess formed in the base has a diameter of 7 mm and a depth of 0.7 mm. The distance between an emitter and the aperture is about 7 mm and where an emission current of the gallium liquid metal ion source is 10 µA or more, the emission half-angle is about 22° and an ion beam can be irradiated on the whole of the recess. The taper is formed at 45° and the inner wall of aperture hole has a length of 200 µm or less in the thickness direction.

The surface of the tungsten base is chemically etched in the atmosphere so as to be formed with fine irregularities. Thereafter, a resulting structure is heated at about 1000° C. in vacuum and after an oxide film has been removed, gallium is dropped onto the surface to form the aperture. If gallium is merely coated in the atmosphere, the wetting capability is bad and the gallium is turned into liquid droplets, so that a uniform liquid level cannot be formed. The quantity of carried gallium is 45 mg in the present embodiment.

Figure 6:
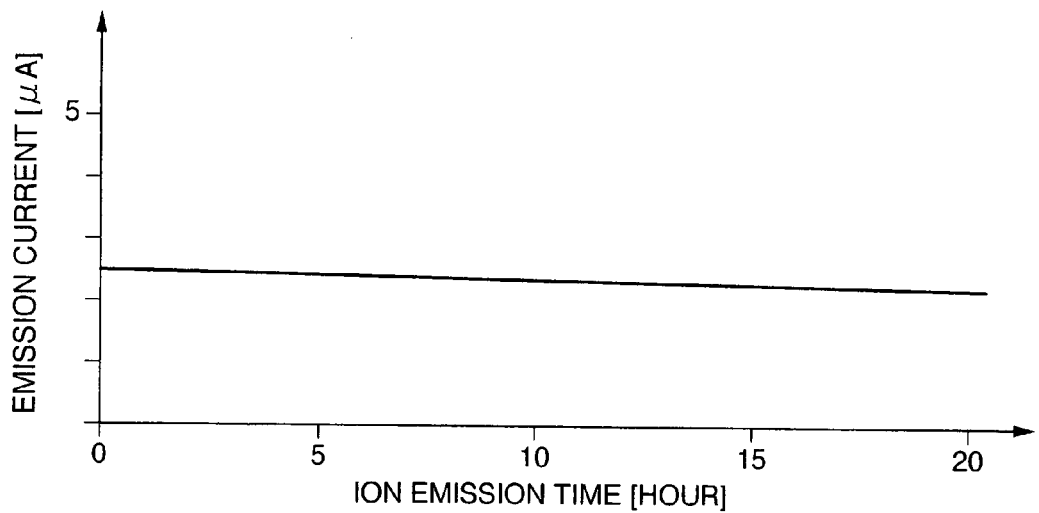
FIG. 6 is a graph showing how emission current of the liquid metal ion source in association with the directly underlying aperture coated with the liquid metal according to the invention changes with time.

With the aperture constructed as above, emission of the ion source is examined to obtain experimental results as graphically illustrated in FIG. 6. Emission kept to be stable for a long time can be accomplished with the emission current changing at a rate of 0.5% per hour. By applying a flashing process at the time that the current value changes, the emission current can be restored to substantially the same value and stable ion emission can continue. The consumptive amount of the coated gallium per hour is known as being about (1.5E−2 mg)/h by measuring a change in weight of the aperture. Accordingly, the quantity of gallium mounted on the surface recess can assure a use of 2000 h or more. This usable time is substantially equal to the lifetime of the gallium liquid metal ion source put on the market.

Embodiment 2

Figure 7:
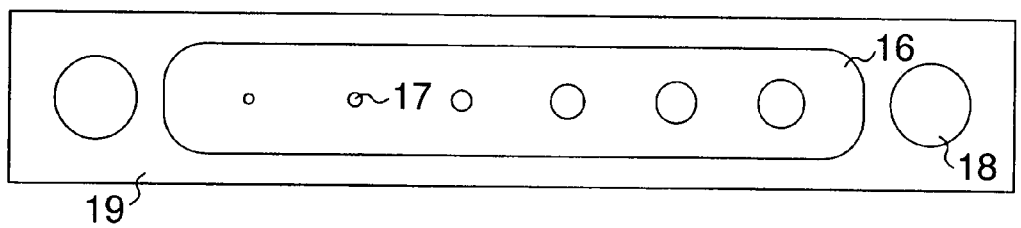
FIG. 7 is a plan view of a variable aperture plate coated with the liquid metal according to the invention.
Figure 8:
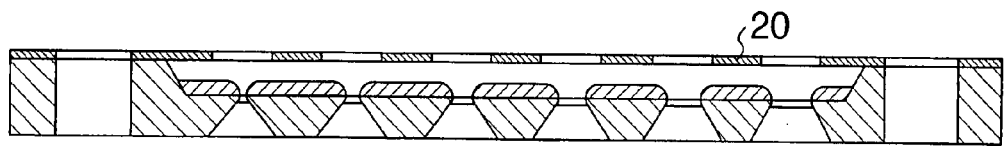
FIG. 8 is a sectional view of the FIG. 7 variable aperture plate.

In embodiment 2 as shown in FIG. 7, the present invention is applied to a variable aperture. In the present embodiment, molybdenum is used as a base material of the aperture. A recess having a width of 1 mm, a length of 6 mm and a depth of 0.5 mm is formed above individual aperture holes of the variable aperture through mechanical working. The inner surface of the recess is worked through etching. A resulting structure is heated at high temperatures and gallium is mounted in the recess. In the optical system, the beam diameter is about 0.5 mm on the aperture during normal operation and the irradiation range is limited to the gallium liquid surface or level. Before being mounted to the apparatus, the aperture is conditioned as shown in FIG. 8. As will be seen from the figure, a shield plate 20 is mounted which is adapted for keeping sputtered gallium from being deposited on an aligner and the like on the upstream side and causing dielectric breakdown. With this construction, an aperture lifetime of more than 2000 hours can be attained.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A focused ion beam apparatus using a liquid metal ion source wherein:
 a liquid metal being used for said liquid metal ion source is concentrated in the vicinity of an aperture hole and forms a cover which does not expose an edge portion of the hole, said aperture hole is tapered on the side opposite to said liquid metal ion source so that an aperture hole diameter increases as it departs from said liquid metal ion source on the side opposite therein, and said aperture is a current limiting aperture disposed immediately beneath said liquid metal ion source.

2. A focused ion beam apparatus according to claim 1, wherein irregularities of a maximum roughness of 1 to 10 µm are formed at a portion which said liquid metal contacts with said aperture.

3. A focused ion beam apparatus according to claim 1, wherein the liquid metal on said aperture has a volume ranging from 5 mm$^3$ to 17 mm$^3$.

4. A focused ion beam apparatus according to claim 1, wherein said liquid metal is gallium and said aperture is tungsten.

5. A liquid metal ion source attachable to a focused ion beam apparatus, wherein:
 a liquid metal being used for said liquid metal ion source is concentrated in the vicinity of an aperture hole and forms a cover which does not expose an edge portion of the hole, said aperture hole is tapered on the side opposite to said liquid metal ion source so that an aperture hole diameter increases as it departs from said liquid metal ion source on the side opposite therein, and said aperture is a current limiting aperture disposed immediately beneath said liquid metal ion source.

6. A liquid metal ion source according to claim 5, wherein irregularities of a maximum roughness of 1 to 10 µm are formed at a portion which said liquid metal contacts with said aperture.

7. A liquid metal ion source according to claim 5, attachable to said focused ion beam apparatus, wherein the liquid metal on said aperture has a volume ranging from 5 mm$^3$ to 17 mm$^3$.

8. A liquid metal ion source according to claim 5, attachable to said focused ion beam apparatus, wherein said liquid metal is gallium and said aperture is tungsten.

* * * * *